(12) United States Patent
Dudnikov, Jr. et al.

(10) Patent No.: US 8,156,640 B2
(45) Date of Patent: Apr. 17, 2012

(54) SUBSTANTIALLY CONTINUOUS LAYER OF EMBEDDED TRANSIENT PROTECTION FOR PRINTED CIRCUIT BOARDS

(75) Inventors: George Dudnikov, Jr., San Jose, CA (US); Franz Gisin, San Jose, CA (US); Gregory J. Schroeder, Morgan Hill, CA (US)

(73) Assignee: Sanmina-SCI Corporation, San Jose, CA (US)

( * ) Notice: Subject to any disclaimer, the term of this patent is extended or adjusted under 35 U.S.C. 154(b) by 555 days.

(21) Appl. No.: 12/245,729

(22) Filed: Oct. 4, 2008

(65) Prior Publication Data
US 2009/0025213 A1 Jan. 29, 2009

Related U.S. Application Data

(62) Division of application No. 11/356,562, filed on Feb. 16, 2006, now Pat. No. 7,688,598.

(51) Int. Cl.
*H05K 3/30* (2006.01)

(52) U.S. Cl. ............... 29/832; 29/830; 29/831; 29/846; 29/847; 29/852

(58) Field of Classification Search ............... 29/823, 29/830, 831, 832, 846, 847, 848, 852; 361/760, 361/56, 111, 220; 439/620, 56; 174/261; 257/773

See application file for complete search history.

(56) References Cited

U.S. PATENT DOCUMENTS

| | | | | |
|---|---|---|---|---|
| 4,729,752 A | * | 3/1988 | Dawson et al. | 439/620.16 |
| 5,246,388 A | * | 9/1993 | Collins et al. | 439/620.08 |
| 5,483,407 A | * | 1/1996 | Anastasio et al. | 361/56 |

* cited by examiner

Primary Examiner — Derris Banks
Assistant Examiner — Tai Nguyen
(74) Attorney, Agent, or Firm — Loza & Loza LLP; Julio M. Loza (57) ABSTRACT

The protection of sensitive components on printed circuit boards by using planar transient protection material in one or more layers of a printed circuit board stackup is disclosed.

19 Claims, 12 Drawing Sheets

SUBSTANTIALLY CONTINUOUS LAYER OF EMBEDDED TRANSIENT PROTECTION FOR PRINTED CIRCUIT BOARDS

CROSS REFERENCE TO RELATED APPLICATION(S)

This application is a divisional of U.S. patent application Ser. No. 11/356,562, filed on Feb. 16, 2006, which claims the benefit of U.S. Ser. No. 60/653,723, filed Feb. 16, 2005, both of which are incorporated herein by reference in their entirety.

BACKGROUND

Printed circuit boards, backplanes, midplanes, printed wiring boards, flex circuits, rigid flex-circuits, multi-chip modules (MCM), interposers and the like are herein referred to collectively as "PCBs".

A via structure typically provides a conductive path between conductive layers in the z-axis direction (orthogonal to the x-y plane of a PCB). Via holes are formed by a variety of techniques including but not limited to laser drilling, mechanical drilling, and techniques based on photo definition. Via holes are subsequently partially or wholly filled or coated with a conductive material, usually metal. Such via structures may be blind, buried, through-hole and may or may not include pads on the conductive layers, as is well known to those skilled in the art of PCB design.

Sensitive components on a printed circuit board can be damaged by transient occurrences of electrostatic discharges (ESD). An ESD is characterized by a rapid rise in the order of tens of kilovolts in a few picoseconds, for example. Other transient phenomena with lower peak voltage levels and slower rise-times can also cause damage to the printed circuit board. For example, a sudden rise in voltage can be caused by a poorly grounded soldering iron, or a power switching relay, or a lightning strike on telecommunication lines that are connected to the printed circuit board. The term "transient" as used herein encompasses not only ESD events but any phenomena, of short duration, that directly or indirectly induces voltages and currents into a printed circuit board and where the amplitudes of such voltages and currents are high enough to cause degradation or failure of the electronic components on the printed circuit board.

Figure 1A:
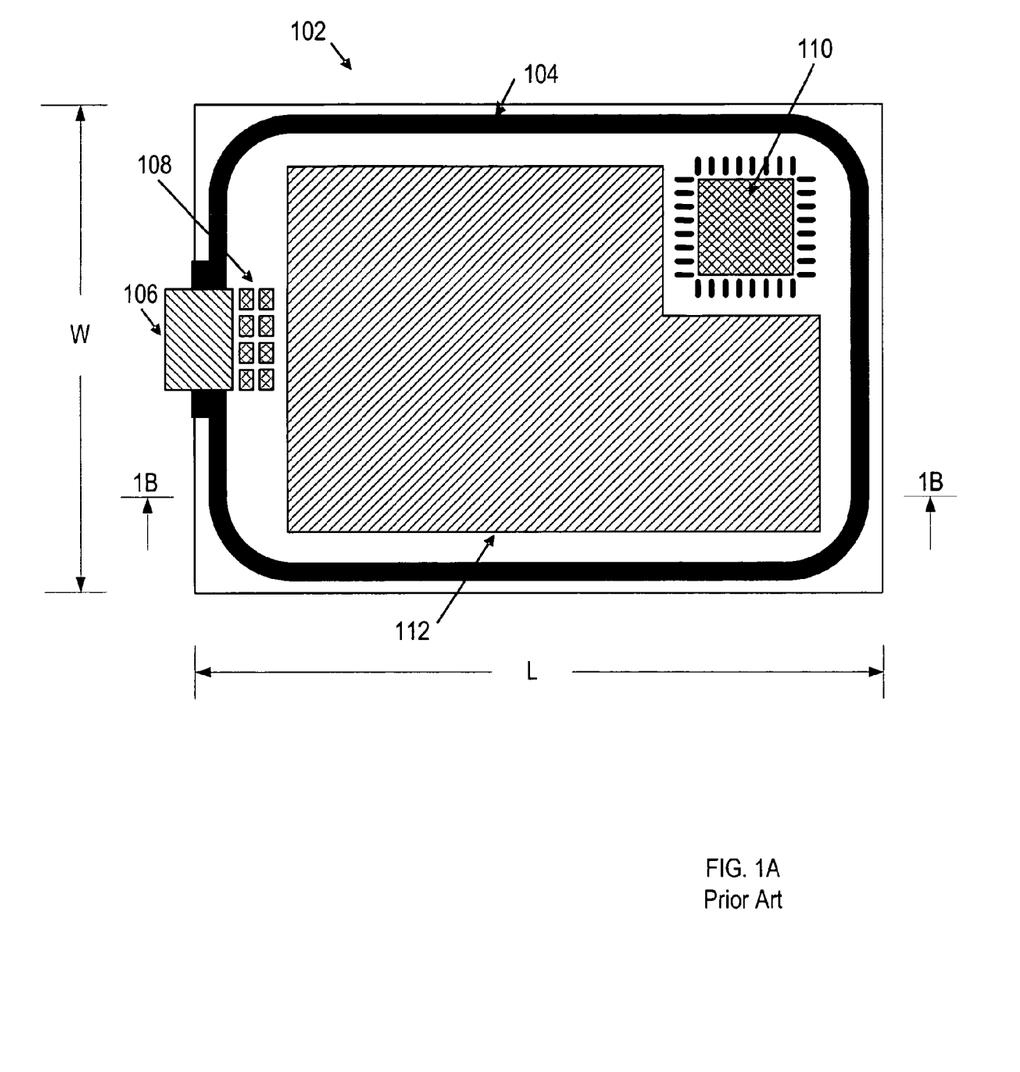
FIG. 1A is a schematic that illustrates a printed circuit board protected by a conductive guard ring.

FIG. 1A is a schematic that illustrates a printed circuit board 102 protected by conductive guard rings 104. Printed circuit board (PCB) 102 has a length L and a width W. In FIG. 1A, conductive guard rings 104 (only one of which is visible in FIG. 1) are added to the periphery of each outer layer of PCB 102 and one or more discrete transient protection devices can be attached to PCB 102. The guard rings 104 are attached to the chassis ground at the location where I/O connectors 106 are mounted to PCB 102. Typically, when a person picks up a PCB, the person will initially touch the periphery of the PCB. By positioning guard rings 104 along the periphery of PCB 102, guard rings 104 re-direct undesired transient currents to chassis ground. Thus, detrimental currents are not allowed to flow to transient sensitive components on PCB 102. However, guard rings fail to protect interior surfaces 112 of PCB 102. Another form of transient protection is the use of discrete transient protection devices.

Discrete transient protection devices such as discrete transient protection devices 108 can be attached to PCB 102 at the location where signal and/or power lines enter PCB 102, such as connector 106. However, discrete transient protection devices consume valuable real estate on the PCB. For example, U.S. Pat. No. 6,657,532 discloses discrete over-voltage protection components made of a thin layer of neat dielectric polymer or glass positioned between a ground plane and an electric conductor. U.S. Pat. No. 6,657,532 also discloses discrete over-voltage protection components having multi-layers of variable voltage material. Another non-limiting example of a discrete transient protection device is a resettable polymeric-positive-temperature-coefficient (PPTC) device or a voltage switchable dielectric material (VSDM). Like fuses, PPTC devices help protect circuitry from overcurrent damage. However, discrete PPTC devices consume valuable real estate on the PCB.

Other forms of transient protection include on-chip transient protection devices 110, such as zener diodes, for example. However, such on-chip transient protection devices do not have sufficient capacity to effectively dissipate large transient events. Both discrete and on-chip transient protection devices often have excessive amounts of intrinsic capacitance that makes such devices unsuitable for use in high speed applications. The primary protection mechanism of both discrete and on-chip transient protection devices is through the conversion of undesired transient energy into heat. Thus, large transient magnitudes and/or repeated exposure to large transient magnitudes are likely to result in over-heating that in turn results in performance degradation of such devices.

Figure 1B:
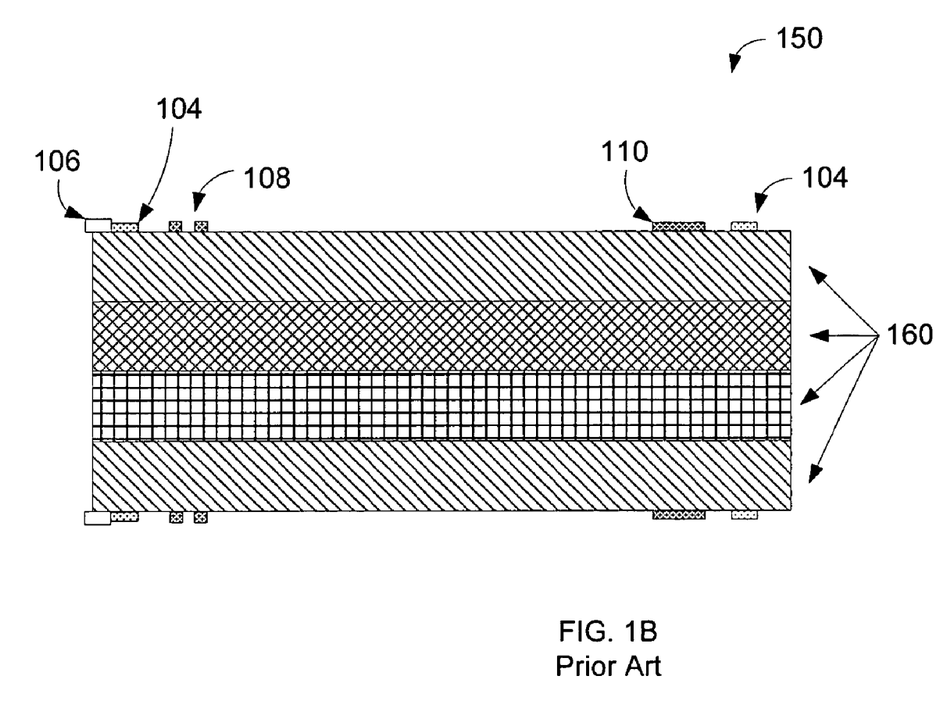
FIG. 1B is a cross section of the PCB 102 of FIG. 1A taken at 1B.

FIG. 1B is a cross section 150 of the PCB 102 of FIG. 1A taken at 1B. Cross section 150 shows that the PCB comprises multi-layers 160 of material. Cross section 150 also shows guard ring 104, on-chip transient protection device 110, connector 106 and discrete protection devices 108.

According to certain embodiments of the invention, a voltage switchable dielectric material can be used as transient protection material. In the past, voltage switchable dielectric material was used to make an insulating substrate that can be made conductive. When conductive, the voltage switchable dielectric material is amenable to electrochemical processing such as electroplating for making conductive traces. Such a method is disclosed by U.S. Pat. No. 6,797,145. Thus, U.S. Pat. No. 6,797,145 discloses the use of voltage switchable dielectric material as an insulating substrate that can be made conductive for making conductive traces.

Thus, in view of the foregoing, an effective form of transient protection is needed.

SUMMARY OF EXEMPLARY EMBODIMENTS

In certain exemplary embodiments, a printed circuit board (PCB) with integrated transient protection comprises multiple layers including at least one reference plane, as defined herein, that includes embedded planar transient protection material.

One advantage of using such a reference plane is that the reference plane acts a heat sink and thus ameliorates degradation of sensitive electronic components on the PCB.

These and other embodiments and other features disclosed herein will become apparent to those of skill in the art upon a reading of the following descriptions and a study of the several figures of the drawing.

DETAILED DESCRIPTION

According to certain embodiments, transient protection can be instituted by positioning planar polymer layers into a PCB stackup. Such embedded planar polymer materials are herein referred to as transient protection materials. Such transient protection materials may be in the form of layers that can be laminated to other layers of material in the PCB stackup. Such transient protection materials may incorporate a base resin of polyimide, epoxy, silicon rubber or other polymers.

Alternatively, the transient protection materials can be coated on one of more layers of the PCB stackup or on one or more layers of conductive material as described in greater detail herein.

According to certain embodiments, the layer of transient protection material can be coated on a layer of conductive foil, either continuously by roll to roll process or by a discrete piece process. The transient protection material is then cured using heat processes or other curing processes. In certain embodiments, the transient protection material is further coated with a resin layer. Non-limiting examples of resin layers include polyimide, epoxy, silicon rubber or other polymers.

The coated conductive foil is used to make a sandwich by using another piece of coated or uncoated conductive foil on the opposite side of one or more pieces of uncured dielectric material. The materials of this sandwich are bonded together under heat and pressure to form a core layer structure. Such a core layer structure can then be processed using standard PCB processes to make the features represented in FIG. 12A through FIG. 14B, described herein, by methods well known to those skilled in the art. The dielectric material can include epoxy, polyimide, teflon or any other polymer. The dielectric material can be un-reinforced as in a film or reinforced with fiberglass of various compositions, or reinforced with random fibers of various compositions. Other methods, as are known to those skilled in the art, can be used to form such a core layer structure.

According to another embodiment, the transient protection material that is coated on the conductive foil can be a polymer such as epoxy or polyimide. This conductive foil can be bonded to another coated or uncoated conductive foil to form the core layer structure. Such a core layer structure can be processed using standard PCB processes to make the features represented in FIGS. 12A through 14B, as described herein, by methods well known to those skilled in the art.

According to a further embodiment, the transient protection material can be selectively removed, by mechanical processes, from areas of the core layer structure after patterning and etching the conductive foil, where the transient protection material is not required. By way of non-limiting examples, such processes include laser ablation or sandblasting.

In certain embodiments, in a core layer structure, the combined thicknesses of the dielectric material and the transient protection material is less then approximately 4 mils. According to certain embodiments, the dielectric layer thickness is in the range of about 0.1 mils to 4 mils. If the conductive foil on one side of the dielectric material and transient protection material composite is a ground plane and the conductive foil on the opposing side of the composite is a power plane, then the core layer structure has the added benefit of embedded distributed capacitance as well as transient protection. A further benefit is the reduction in plane inductance by bringing the power conductive layer closer to the ground conductive layer. In other words, as the dielectric layer and transient protection material becomes thinner, capacitance is increased and inductance is decreased. By increasing capacitance and decreasing inductance quieter power distribution systems are produced, which in turn allow cleaner signals at higher frequencies. Some components, such as discrete capacitors, may further be removed from the surface of the PCB, thus reducing cost.

The amount of capacitance generated in this embedded planar capacitor is dependent upon the dielectric constants of the transient protection material and the dielectric used in the composite, the planar area of the power-ground conductive layer pair and the thickness of the composite. The amount of capacitance generated by this structure can be calculated as:

$$C = \frac{0.2244\epsilon_r A}{d}$$

where
C=capacitance in picofarads
A=area in square inches
$\epsilon_r$=relative dielectric constant
d=dielectric thickness in inches It should be noted that the ranges of conductive material thicknesses, resin and transient protection material types and the presence of reinforcement or non reinforcement in the dielectric material as illustrated herein also apply to embedded distributed capacitors with transient protection.

Figure 2:
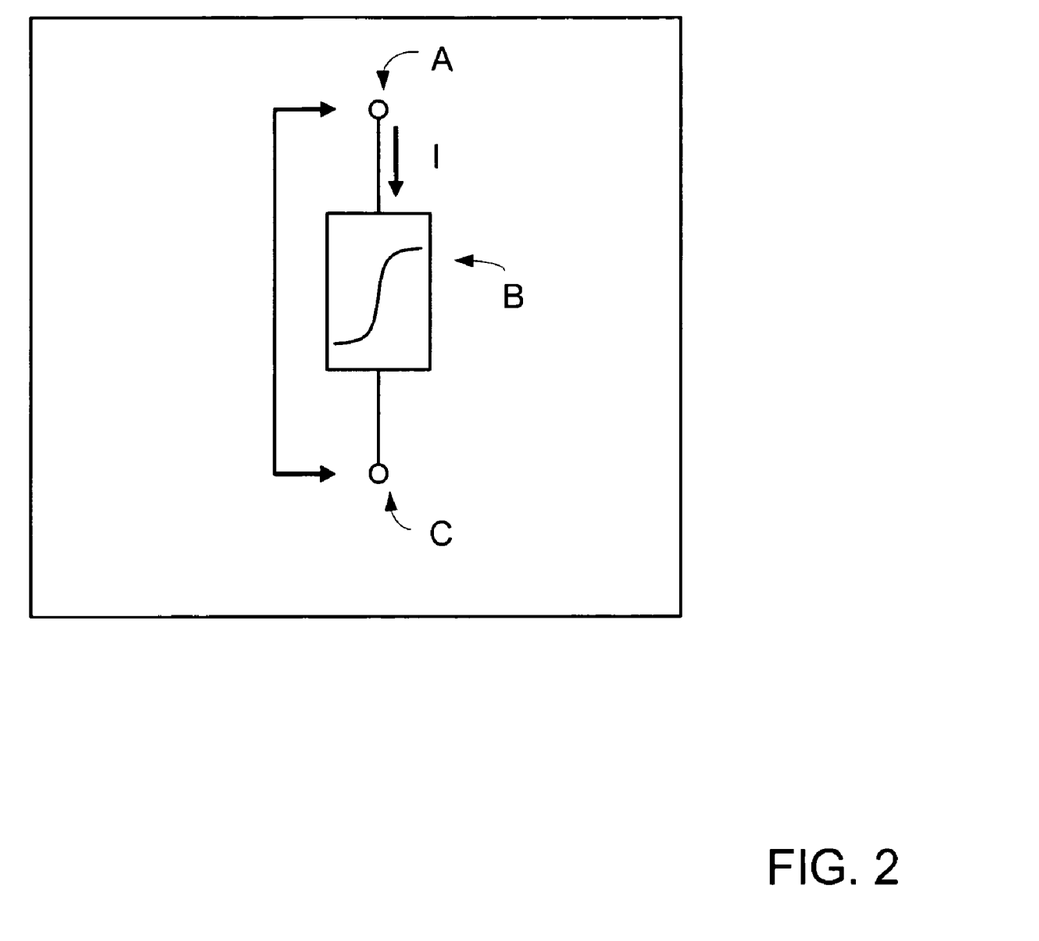
FIG. 2 is a schematic that illustrates a polymer region between two contact regions of a circuit that requires protection from transients.

FIG. 2 is a schematic that illustrates a polymer region (transient protection region) between two contact regions A and C of a circuit where protection from transients is needed. In FIG. 2, symbol B indicates a region of embedded planar transient protection material. In FIG. 2, region A and region C schematically represent the two contact regions where the transient protection polymer is attached to the circuit that needs protection from over currents and/or over-voltages. Regions A, B and C are volumetric regions within a given PCB stackup rather than discrete points.

Figure 3:
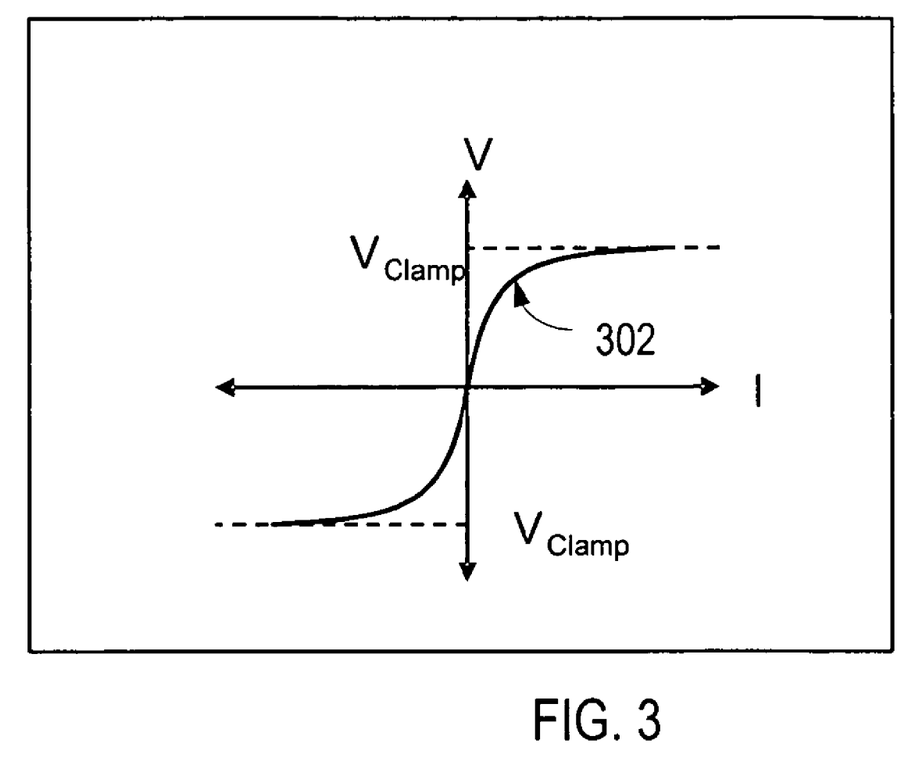
FIG. 3 is a graph that illustrates voltage clamping provided by embedded transient protection material.

According to certain embodiments, in a majority of cases, the planar transient protection material behaves in a bi-directional manner in that the material has the capability of clamping both positive and negative transients. FIG. 3 is a graph that illustrates voltage clamping provided by planar transient protection material. The resistance of the planar transient protection material that offers bi-directional protection changes in response to applied voltage in the manner as indicated in FIG. 3.

In FIG. 3, resistance is represented by the slope of curve 302. A steep slope corresponds to a high resistance. Likewise, a shallow slope corresponds to a low resistance. During normal operation, the voltage experienced by the transient protection region is low and the corresponding resistance is high. However, when the transient protection region encounters a high transient voltage event, the resistance of the transient protection polymer material decreases and consequently allows more current to flow through the transient protection region. The decrease in resistance in the transient protection region limits the peak excursion of the transient voltage by clamping the transient voltage to a safe level while simultaneously re-directing the currents associated with the transient voltage to a nearby low impedance reference planar region. As known to those skilled in the art, the low impedance reference planar region may be a power distribution plane, a chassis ground plane, an analog ground plane, or a digital ground plane. Such a low impedance reference region that is integrated with transient protection material is herein referred to as a reference plane. More specifically, such a reference plane excludes signal planes.

By way of non-limiting examples, the area of the planar transient protection region is greater than the area containing conductive traces, and is positioned under a reference plane.

Figure 4A:
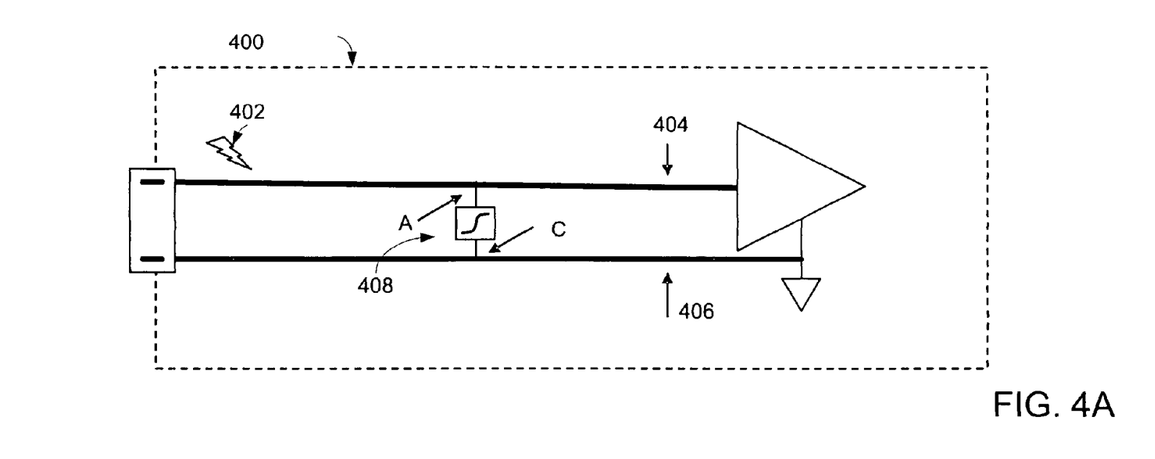
FIG. 4A is a schematic that illustrates the protection of a circuit trace from transients by using an embedded transient protection material to contact a portion of the circuit trace.

When the planar transient protection material is distributed across the PCB, many protection points can be simultaneously incorporated into the PCB. FIG. 4A is a schematic that illustrates the protection of a circuit from transients by using an embedded planar transient protection material to contact a portion of the circuit. FIG. 4A shows PCB region 400, victim circuit 404, victim circuit reference 406, and embedded protection region 408. For purposes of explanation, assume that a transient voltage 402 enters PCB region 400 at victim circuit 404. The transient protection region 408 is incorporated in the middle of the interconnect. When transient protection region 408 encounters the transient voltage 402, transient protection region 408 operates to clamp the peak voltage to a safe level. Any excessively high levels of current due to transient voltage 402 are shunted to the victim circuit reference which can be a power a plane or ground plane, etc. In other words, the excess current is re-directed to a reference plane.

Figure 4B:
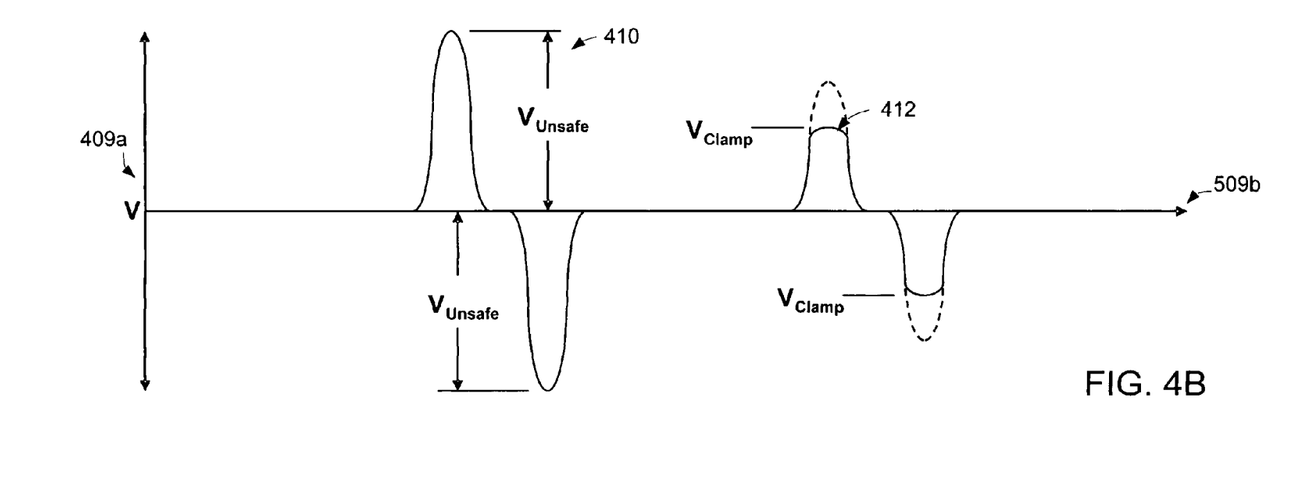
FIG. 4B is a graph that illustrates the unsafe voltage levels of regions that are not protected by an embedded transient protection material and clamped voltage levels for regions that are protected by an embedded transient protection material.

FIG. 4B is a graph that illustrates the unsafe voltage levels of regions that are not protected by an embedded transient protection material and clamped voltage levels for regions that are protected by an embedded transient protection material. FIG. 4B shows a graph with voltage along the vertical axis 409a and current on the horizontal axis 409b. When a transient voltage, such as transient voltage 402 of FIG. 4A, enters the PCB, voltage levels are at unsafe levels 410. However, when the transient voltage encounters the transient protection region such as transient protection region 408 of FIG. 4A, the voltage is clamped to a safe level 412.

The use of transient protection material in PCBs involves two major aspects. First, the transient protection material needs to be optimally positioned within the PCB stackup. Second, the conductive trace and via geometries used for connecting the polymer-loaded core laminates to the circuits must be added.

According to certain embodiments, the planar transient protection material can be layered with different materials to form laminates and cores (composites) that are useful for making PCB stackups. FIG. 5 through FIG. 11 illustrate various structures that include at least one layer of planar transient protection material.

The manufacturing techniques for the structures illustrated in FIG. 5 through FIG. 11 include single and sequential laminate buildup manufacturing techniques. However, the techniques may vary from implementation to implementation. For example, the transient protection material can be roller coated on, screen-printed on, lip coated, slot coated, curtain coated, painted, or sprayed on to a layer of conductive material or dielectric material. The layer of conductive material may be processed either in roll to roll form as a continuous layer or in discrete pieces. Further, a layer of conductive material can be coated with transient protection material then bonded to other structures by pressing the coated conductive layer to the dielectric material and applying heat and pressure. A non-limiting example of a dielectric material is a B-Stage material.

Figure 5:
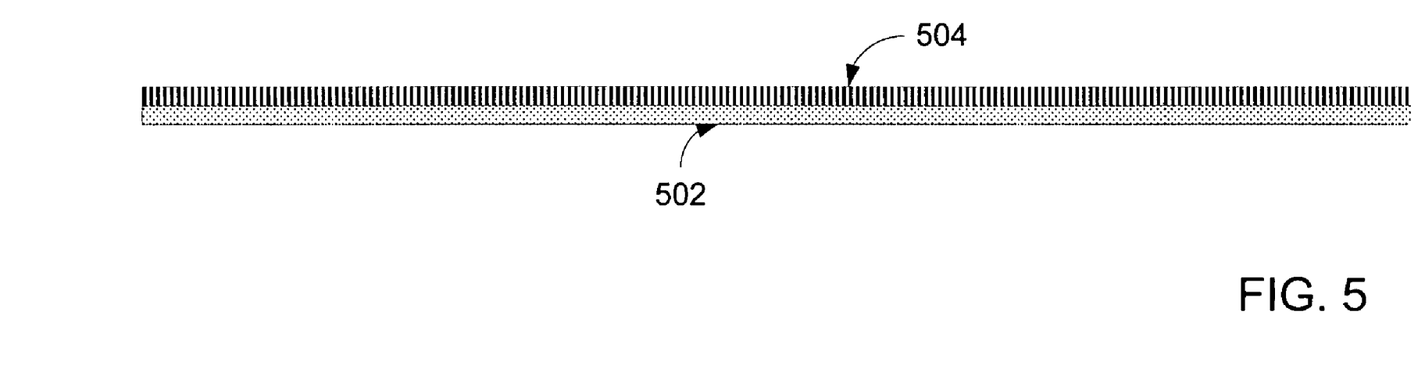
FIG. 5 is a block diagram that illustrates a layer of conductive material coated with a layer of transient protection material.

FIG. 5 is a block diagram that illustrates a layer of conductive material coated with a layer of transient protection material. FIG. 5 shows a copper foil 502 coated with a liquid precurser of transient protection material 504. The liquid precursor, once coated, is then cured. In certain embodiments, the curing process may be performed when the structure illustrated by FIG. 5 is further bonded to a substrate as described previously. According to certain embodiments, the transient protection material can be a non-linear polymer based on resettable polymeric-positive-temperature-coefficient (PPTC) technology or a voltage switchable dielectric material (VSDM). In certain embodiments, the PPTC polymers have relatively low inherent capacitances in order to offer transient protection to circuitry with high speed signal lines. The layer of transient protection material 504 can be added on to the layer of conductive material or copper foil through a variety of techniques as previously described above.

Figure 6:
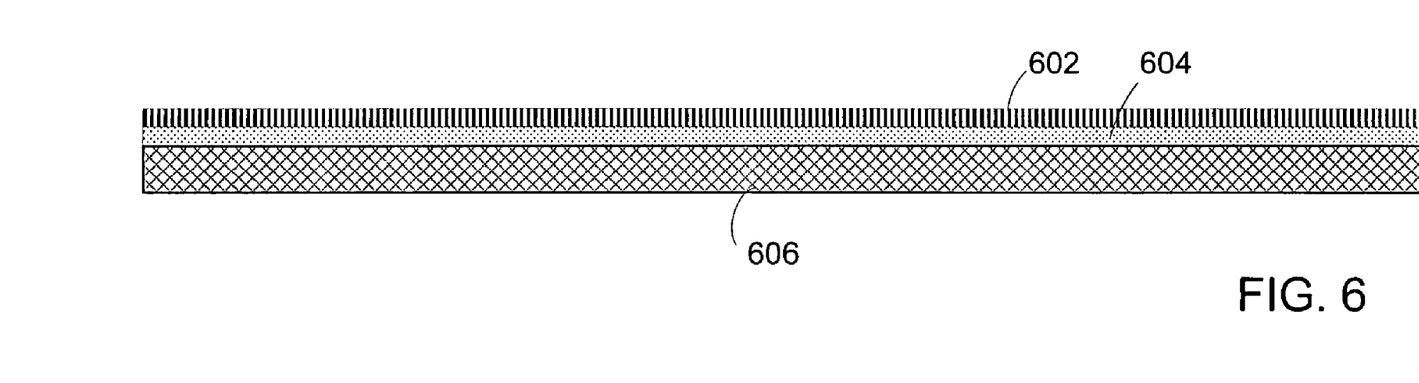
FIG. 6 is a block diagram that illustrates a layer of cured dielectric material bonded with a layer of transient protection material coated conductive foil.

FIG. 6 is a block diagram that illustrates a single-sided composite layer comprising a layer of conductive material coated with a layer of transient protection material bonded to a layer of cured or uncured dielectric material. The structure of FIG. 6 can be made by coating a layer of conductive material 602, such as copper foil, with a layer of transient protection material 604 on one surface. The resulting structure is then laminated to a layer of dielectric material 606 by applying heat and pressure.

Figure 7:
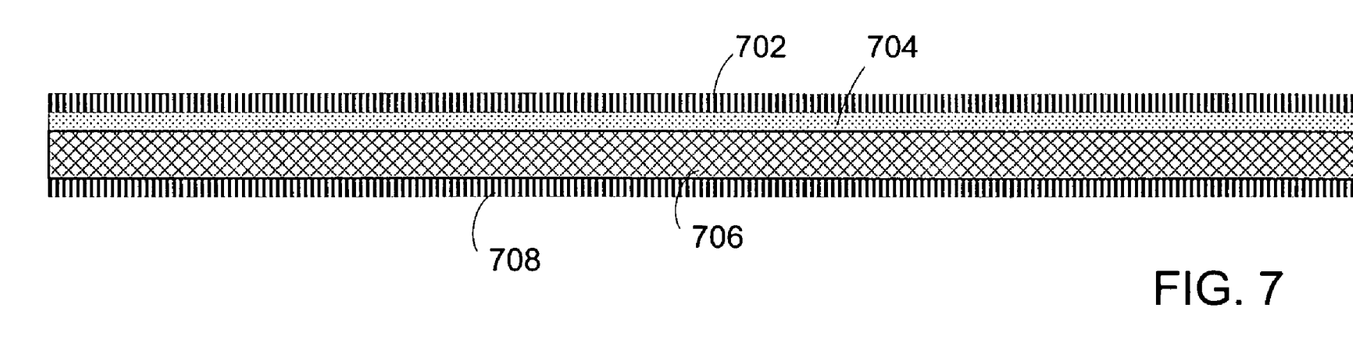
FIG. 7 is a block diagram that illustrates a layer of dielectric material bonded with a layer of transient protection material coated conductive foil on one side and a layer of conductive material on the opposing side.

FIG. 7 is a block diagram that illustrates a double-sided composite layer with one layer of transient protection material. The structure of FIG. 7 is made with a layer of conductive material 702, such as copper foil, coated with a layer of transient protection material 704. The resulting structure is laminated on one surface of a layer of dielectric material 706 composed of one or more cured or uncured layers of dielectric material. Another layer of uncoated conductive material 708 is laminated on the other surface of the dielectric material. The above operations for making the structure of FIG. 7 are performed simultaneously, according to certain embodiments.

Figure 8:
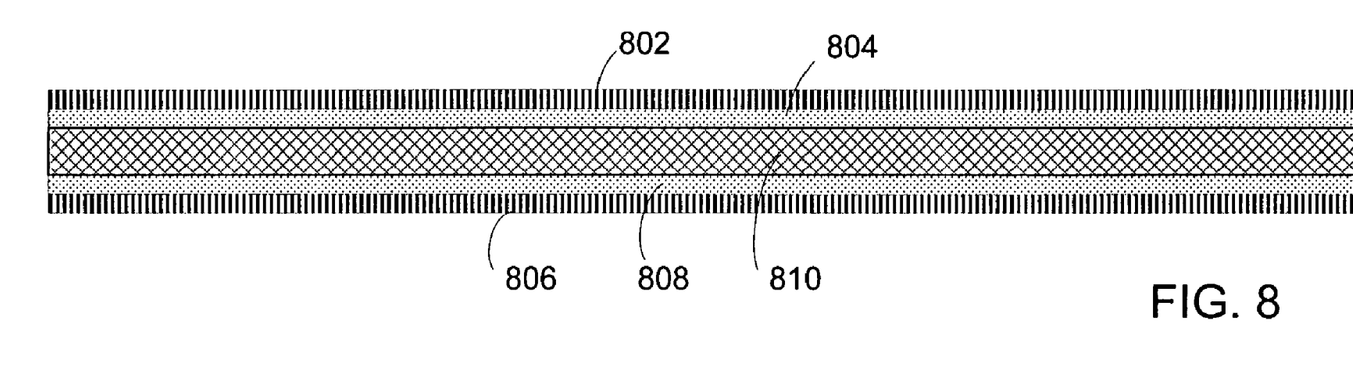
FIG. 8 is a block diagram that illustrates a double-sided composite layer with a layer of cured dielectric material sandwiched between two layers of conductive material coated with transient protection material bonded.

FIG. 8 is a block diagram that illustrates a double-sided composite layer with a layer of cured dielectric material sandwiched between two layers of conductive material coated with transient protection material bonded. The structure in FIG. 8 is made by sandwiching a layer of dielectric material 810 between a layer of conductive material 802, such as copper foil, coated with a layer of transient protection material 804 and another layer of conductive material 806 coated with a layer of transient protection material 808. The transient protection materials on the different coated conductive foils may be of different properties. The dielectric material can be composed of one or more cured or uncured layers of dielectric material. Heat and pressure is applied to the resulting sandwich. The above operations for making the structure of FIG. 8 are performed simultaneously, according to certain embodiments.

Figure 9:
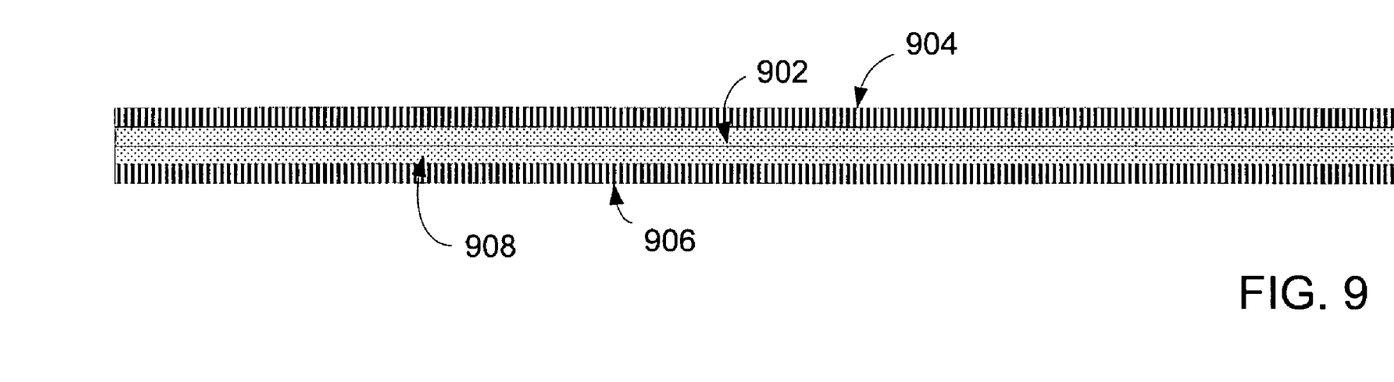
FIG. 9 is a block diagram that illustrates a conductive layer coated with a layer of transient protection material and that is bonded to an opposing layer of conductive material coated with a layer of transient protection material.

FIG. 9 is a block diagram that illustrates a layer of conductive material coated with a layer of transient protection material and that is bonded to another layer of conductive material coated with a layer of transient protection material. The structure of FIG. 9 is made by bonding two structures 502 and 504 of FIG. 5 together. In other words the structure comprises a layer of conductive material 902 coated with a layer of transient protection material 904, which is then bonded with a layer of conductive material 906 coated with a layer of transient protection material 908. The above operations for making the structure of FIG. 9 are performed simultaneously, according to certain embodiments.

Figure 10:
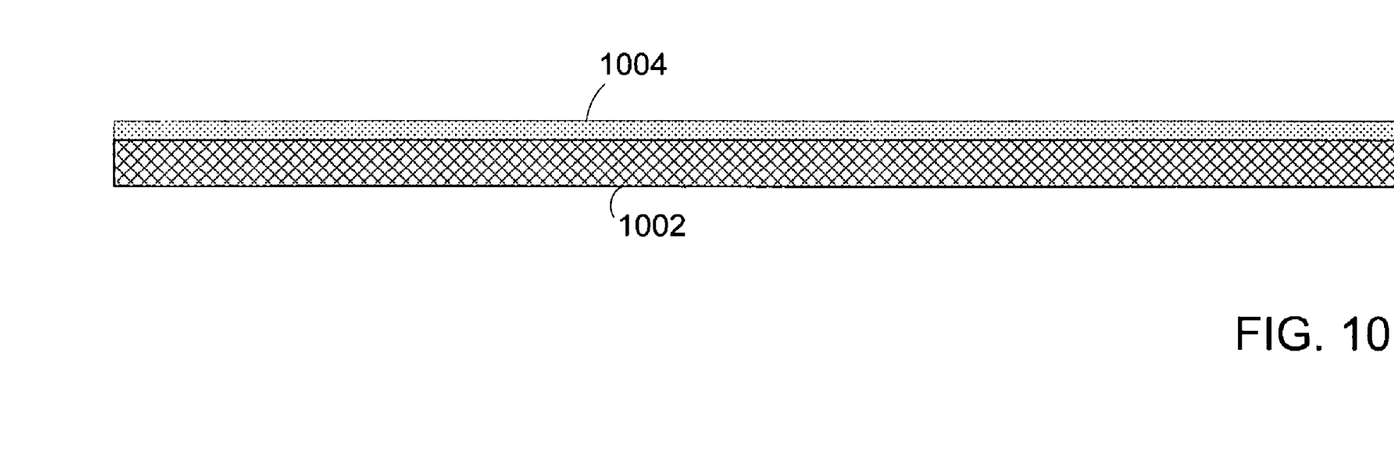
FIG. 10 is a block diagram that illustrates a layer of cured dielectric material coated with a layer of transient protection material.

FIG. 10 is a block diagram that illustrates a layer of cured dielectric material to which is added a layer of transient protection material. FIG. 10 shows a layer of dielectric material 1002 and a layer of transient protection material 1004. The layer of transient protection material can be added on to a layer of dielectric material through a variety of techniques as previously described above. From this structure, other structures may be made if layers of conductive material are bonded to the surfaces of the layer of dielectric material. The resulting structures would resemble the structures illustrated in FIG. 6 and FIG. 7.

Figure 11:
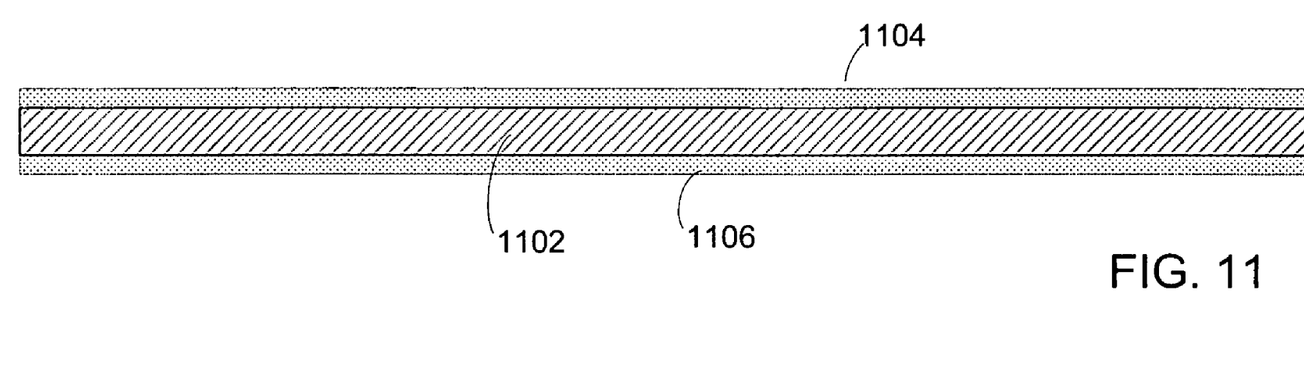
FIG. 11 is a block diagram that illustrates a layer of transient protection material coated on either side of a cured dielectric material.

FIG. 11 is a block diagram that illustrates a layer of dielectric material coated with a layer of transient protection material on either side. The structure of FIG. 11 is similar to the structure illustrated in FIG. 10 except that the dielectric material 1102 is coated on both surfaces (top and bottom) with transient protection material 1104 and 1106. Each layer of transient protection material can be added on to the layer of dielectric material through a variety of techniques as previously described above. From this structure, other structures may be made if layers of conductive material is bonded to the opposing sides of the coated layers of dielectric material. The resulting structure would resemble the structure illustrated in FIG. 9.

Figure 12A:
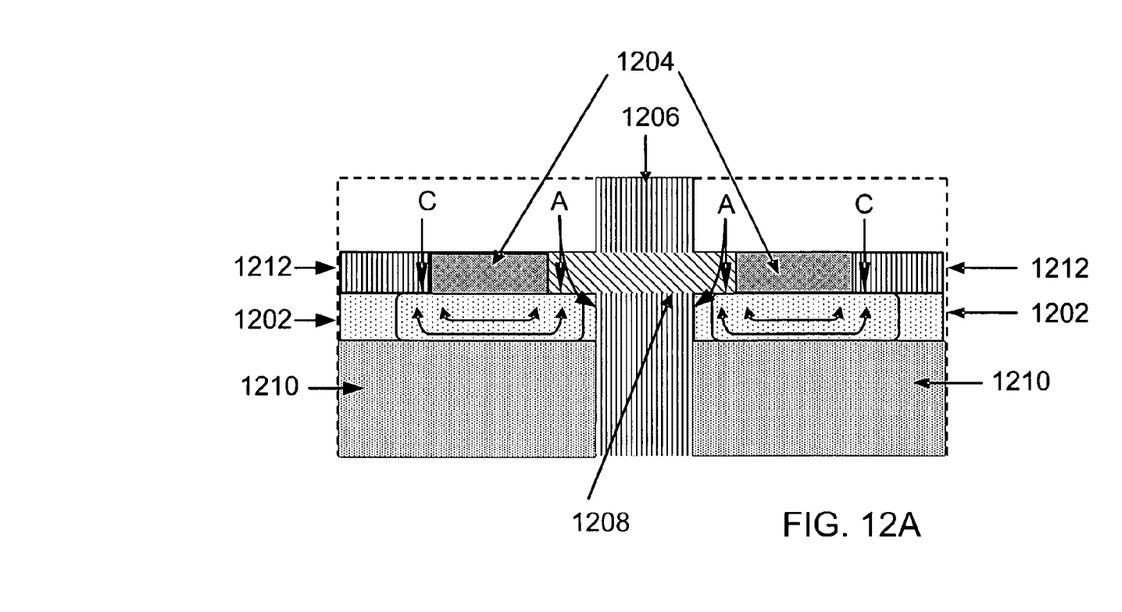
FIG. 12A is a block diagram that illustrates a transient protection region across a via anti-pad with a via pad.

FIG. 12A is a block diagram that illustrates a transient protection region across a via anti-pad with a via pad. FIG. 12A shows a cross section of a transient protection region 1202 that bridges anti-pad regions 1204 of a via structure 1206 (or via barrel) with a via pad 1208 present. FIG. 12A also shows dielectric region 1210 and contact regions A and C where the transient protection material contacts the via pad 1208 and conductive material 1212, respectively. Such a structure can be used to provide transient protection for a variety of circuit topologies where the conducting portion of the circuit to be protected is routed between layers of the PCB stackup. The via pads and corresponding antipads may be polygonal shapes including by way of non limiting example square, round or oval shapes. Any via structure that is constructed in this manner will be protected by the transient protection region, as a via structure that penetrates through the PCB will contact the transient protection region.

Figure 12B:
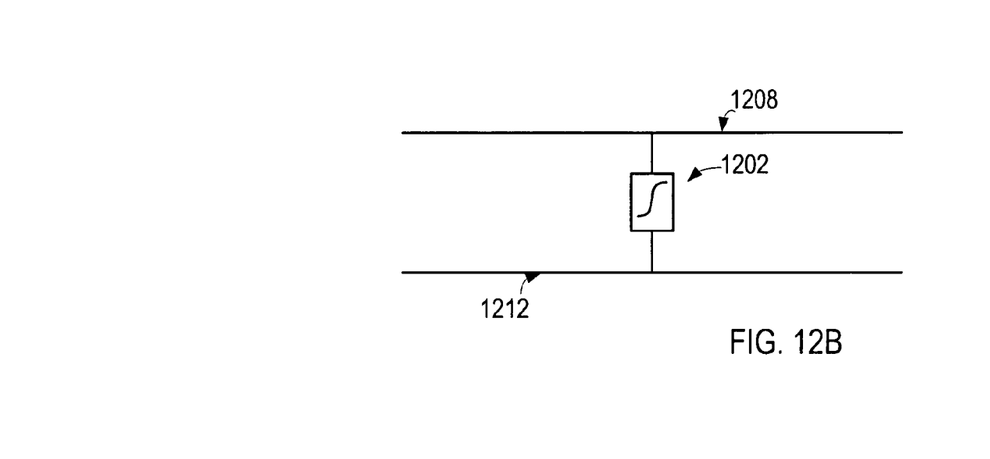
FIG. 12B is a circuit representation of FIG. 12A.

FIG. 12B is a circuit representation of FIG. 12A showing the corresponding positions of via pad 1208 with conductive regions 1212 and the transient protection material 1202 connecting the via pad 1208 with the conductive region 1212.

Figure 13:
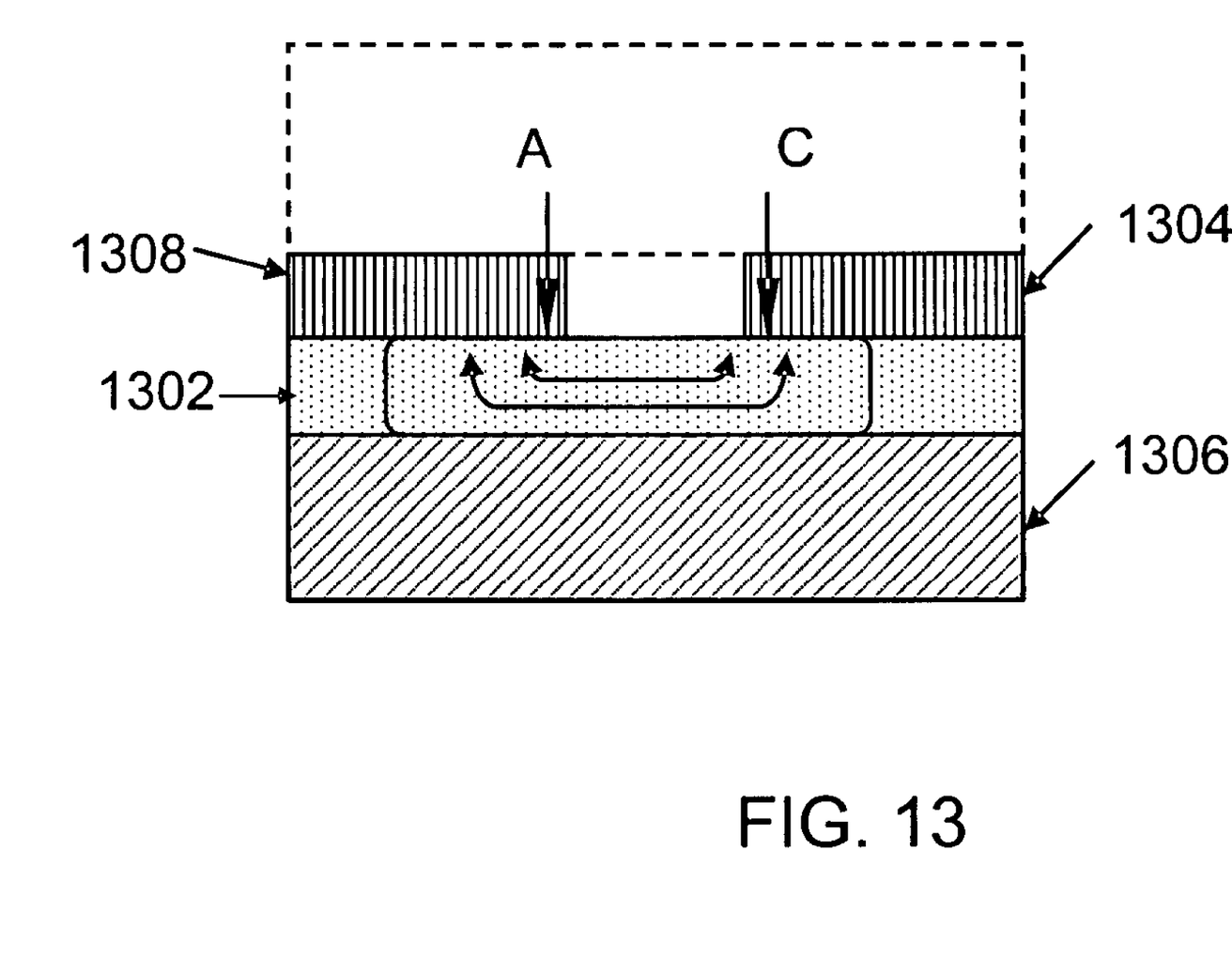
FIG. 13 is a block diagram that illustrates a transient protection region.

FIG. 13 is a block diagram that illustrates a transient protection region. In particular, FIG. 13 shows a cross section of a transient protection region comprising a layer of transient protection polymer 1302 laminated across two sections, A and C, of two conductive layers 1304 and 1308 over an adjacent dielectric layer 1306. The structure of FIG. 13 can provide transient protection for a variety of circuit to reference plane topologies where two conducting regions are adjacent to each other and separated by a non-conductive region. Examples include but are not limited to transmission line structures that are embedded in a reference planar layer and reference planes of different voltage potentials adjacent to each other. Other non-limiting examples include slot lines, coplanar waveguides, edge-coupled differential pair transmission lines and moats of non-conductive areas separating different ground and power regions in reference planes.

Figure 14A:
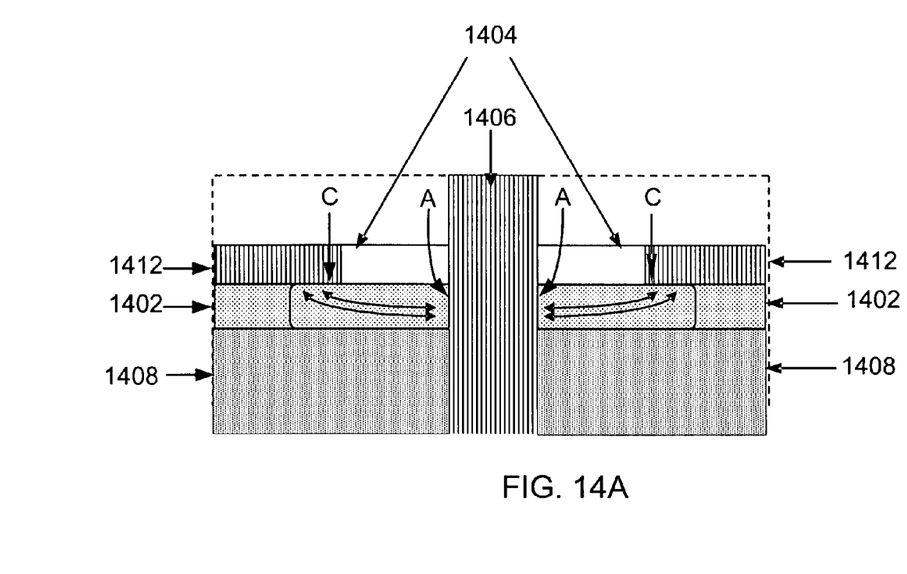
FIG. 14A is a block diagram that illustrates a transient protection region across a via anti-pad without a via pad.

FIG. 14A is a block diagram that illustrates a transient protection region across a via anti-pad without a via pad. FIG. 14A shows a cross section of a transient protection region 1402 that bridges an anti-pad region 1404 of a via structure 1406 that is without a via pad. FIG. 14A also shows dielectric region 1408 and contact regions A and C where the transient protection material contacts the via structure 1406 and conductive material 1412, respectively. Such a structure can be used to provide transient protection for circuits where non-functional pads are not present. The antipads may be polygonal shapes including by way of non limiting examples: square, round or oval shapes. As prior mentioned, any via structure that is constructed in this manner will be protected by the transient protection region, as a via structure that penetrates through the PCB will contact the transient protection region, even without a via pad present.

Figure 14B:
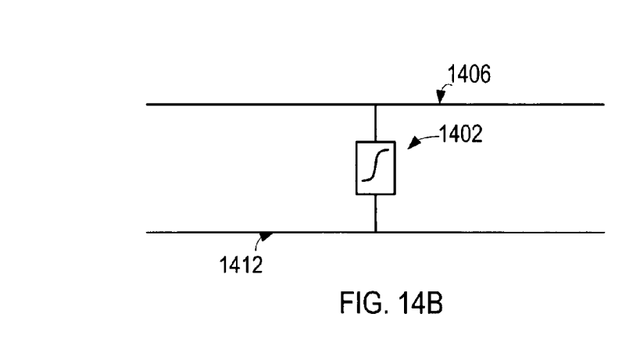
FIG. 14B is a circuit representation of FIG. 14A.

FIG. 14B is a circuit representation of FIG. 14A showing the corresponding positions of via structure 1406 with conductive regions 1412 and the transient protection material 1402 connecting the via structure 1406 with the conductive region 1412.

In the foregoing specification, embodiments of the invention have been described with reference to numerous specific details that may vary from implementation to implementation. The specification and drawings are, accordingly, to be regarded in an illustrative rather than a restrictive sense.

We claim:

1. A method for making a core layer structure for use in PCB manufacturing, the method comprising:
   using a first layer of conductive foil;
   coating a layer of transient protection material on one surface of the conductive foil;
   using one or more layers of B-stage dielectric material to bond said coated first layer of conductive foil on one surface of said one or more layers of B-stage dielectric material with a second layer of conductive foil on the opposing surface.

2. The method as recited in claim 1, wherein said transient protection material behaves in a bi-directional manner for clamping both positive and negative transients of at least one of current and voltage.

3. The method as recited in claim 1, further comprising:
bonding said coated conductive foil to at least one surface of a layer of dielectric material to form said core layer structure, wherein said layer of dielectric material is un-reinforced film.

4. The method as recited in claim 1, further comprising:
bonding said coated conductive foil to at least one surface of a layer of dielectric material to form said core layer structure, wherein said layer of dielectric material is reinforced with fiberglass material of varying composition.

5. A method for making a core layer structure for use in PCB manufacturing, the method comprising:
using a layer of conductive material, said layer of conductive material having a top surface and a bottom surface; and
coating a layer of transient protection material on one of said top surface and said bottom surface.

6. The method as recited in claim 5, further comprising bonding said coated conductive material to at least one surface of a layer of dielectric material to form said core layer structure.

7. The method as recited in claim 6, wherein said layer of dielectric material is any one of: epoxy, polyimide, teflon and any nonconducting polymer.

8. The method as recited in claim 6, wherein said layer of dielectric material is un-reinforced film.

9. The method as recited in claim 6, wherein said layer of dielectric material is reinforced with fiberglass material of varying composition.

10. The method as recited in claim 6, wherein said layer of dielectric material is reinforced with random fibers of various compositions.

11. The method as recited in claim 6, further comprising laminating said core layer structure to a PCB stackup.

12. The method as recited in claim 5, wherein said layer of conductive material is coated with a resin.

13. The method as recited in claim 12, wherein said resin is any one of a polyimide and an epoxy polymer.

14. The method as recited in claim 5, wherein exposed areas of said layer of transient protection material is removed by mechanical methods.

15. The method as recited in claim 5, wherein said transient protection material behaves in a bi-directional manner for clamping both positive and negative transients of at least one of current and voltage.

16. A method for making a printed circuit board with integrated transient protection, the method comprising:
making said printed circuit board using multiple layers including at least one signal area, and at least one reference plane; and
making said at least one reference plane using transient protection material and at least one layer of conductive material.

17. The method as recited in claim 16, wherein said transient protection material behaves in a bi-directional manner for clamping both positive and negative transients of at least one of current and voltage.

18. The method as recited in claim 16, further comprising:
bonding said at least one reference plane to at least one surface of a layer of dielectric material, wherein said layer of dielectric material is un-reinforced film.

19. The method as recited in claim 16, further comprising:
bonding said at least one reference plane to at least one surface of a layer of dielectric material, wherein said layer of dielectric material is reinforced with fiberglass material of varying composition.

* * * * *